United States Patent
Qin et al.

(10) Patent No.: US 9,576,989 B2
(45) Date of Patent: Feb. 21, 2017

(54) ARRAY SUBSTRATE AND THE METHOD FOR MAKING THE SAME, AND DISPLAY DEVICE

(71) Applicant: BOE TECHNOLOGY GROUP CO., LTD., Beijing (CN)

(72) Inventors: Wei Qin, Beijing (CN); Wenqi Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 355 days.

(21) Appl. No.: 14/348,297

(22) PCT Filed: Apr. 27, 2013

(86) PCT No.: PCT/CN2013/074848
§ 371 (c)(1),
(2) Date: Mar. 28, 2014

(87) PCT Pub. No.: WO2014/117444
PCT Pub. Date: Aug. 7, 2014

(65) Prior Publication Data
US 2016/0111455 A1    Apr. 21, 2016

(30) Foreign Application Priority Data

Feb. 1, 2013   (CN) .......................... 2013 1 0041932

(51) Int. Cl.
*H01L 27/12* (2006.01)
*G02F 1/1362* (2006.01)
*G02F 1/1333* (2006.01)

(52) U.S. Cl.
CPC ..... *H01L 27/1288* (2013.01); *G02F 1/133345* (2013.01); *G02F 1/136227* (2013.01); *H01L 27/124* (2013.01)

(58) Field of Classification Search
CPC .......................... H01L 27/1288; H01L 27/124
See application file for complete search history.

(56) References Cited

U.S. PATENT DOCUMENTS

2007/0298554 A1* 12/2007 Long ................. G02F 1/136227
                                                                     438/160
2008/0143909 A1   6/2008 Lee et al.
(Continued)

FOREIGN PATENT DOCUMENTS

CN          101179053 A       5/2008
CN          101206361 A       6/2008
(Continued)

OTHER PUBLICATIONS

Second Chinese Office Action dated May 26, 2015; Appln. No. 201310041932.6.
(Continued)

*Primary Examiner* — Douglas Menz
(74) *Attorney, Agent, or Firm* — Ladas & Parry LLP (57) ABSTRACT

An array substrate and the method for making the same, and a display device are provided. The method includes step 1, forming a pattern comprising a gate electrode and a gate line on a substrate, and providing photoresist at a position reserved for a first via hole above the gate line in a non-display area; step 2, forming a pattern of functional layers of a thin film transistor (TFT) and a data line on the substrate after the above step; step 3, forming a pattern comprising a first pixel electrode on the substrate after the above steps, and then forming a passivation layer; step 4, removing the photoresist provided above the position reserved for the first via hole and film layer thereabove from the substrate after the above steps, so as to form the first via hole.

14 Claims, 4 Drawing Sheets

(56) References Cited

U.S. PATENT DOCUMENTS

| | | | |
|---|---|---|---|
| 2008/0169470 A1 | 7/2008 | Lim et al. | |
| 2009/0146151 A1 | 6/2009 | Shen | |
| 2011/0068341 A1* | 3/2011 | Li | H01L 27/12 257/59 |
| 2014/0054581 A1 | 2/2014 | Song et al. | |

FOREIGN PATENT DOCUMENTS

| | | |
|---|---|---|
| CN | 101211930 A | 7/2008 |
| CN | 101236932 A | 8/2008 |
| CN | 101556935 A | 10/2009 |
| CN | 101728333 A | 6/2010 |
| CN | 102681276 A | 9/2012 |
| CN | 102707523 A | 10/2012 |

OTHER PUBLICATIONS

International Preliminary Report on Patentability dated Aug. 4, 2015; PCT/CN2013/074848.
First Chinese Office Action dated Dec. 18, 2014; Appln. No. 201310041932.6.
International Search Report mailed Nov. 7, 2013; PCT/CN2013/074848.
Third Chinese Office Action dated Oct. 9, 2015; Appln. No. 201310041932.6.

\* cited by examiner

ARRAY SUBSTRATE AND THE METHOD FOR MAKING THE SAME, AND DISPLAY DEVICE

FIELD OF THE INVENTION

The embodiment of present invention relates to an array substrate and the method for making the same, and a display device.

BACKGROUND

With the continuous development of science and technology, user has an ever increasing demand for the display device. TFT-LCD (Thin Film Transistor-Liquid Crystal Display) becomes the principal display used in the products, such as the cellphone, the tablet and so on. Furthermore, as the display device is becoming popular, user also has a more and more common requirement for high hue quality, high contrast, high viewing angle, high response speed and low power dissipation, OLED (Organic Light -Emitting Diode) thus gradually enters into vision of the user.

In prior art, however, the array substrate used in the TFT-LCD or OLED display commonly requires five to eight times of photoetching processes during the manufacturing process thereof. Due to the times of photoetching technology has a direct influence on the manufacture cost and yield rate of the display device, therefore, a manufacture procedure comprising reduced times of photoetching technology is increasingly catching attention from the companies in operation, while becoming the objective pursued by this industry.

SUMMARY

One embodiment of the present invention provides a method for manufacturing an array substrate, comprising:

step 1, forming the pattern comprising a gate electrode and a gate line on the substrate, and providing photoresist at a position reserved for a first via hole above the gate line in a non-display area;

step 2, forming a pattern of functional layers of a thin film transistor (TFT) and the data line on the substrate after the above steps;

step 3, forming a pattern comprising a first pixel electrode on the substrate after the above steps, and then forming a passivation layer;

step 4, removing the photoresist provided above the position reserved for the first via hole and film layer thereabove from the substrate after the above steps, so as to form the first via hole.

In one example, after step 2, photoresist is retained at a position reserved for a second via hole above the data line in the non-display area; or alternatively, in step 3, photoresist is provided at the position reserved for the second via hole above the data line in the non-display area, and between the first pixel electrode and the passivation layer, and in step 4, while removing the photoresist provided above the position reserved for the first via hole so as to form the first via hole, removing the photoresist provided at the position reserved for the second via hole to form the second via hole.

In one example, between the steps 2 and 3, further comprises:

Removing the photoresist at the position reserved for the first via hole above the gate line in the non-display area as well as the film layer thereabove;

The step 3 further comprises:

Providing photoresist between the first pixel electrode and the passivation layer at a position corresponding to the position reserved for the first via hole.

In one example, the step 1 further comprises:

forming a gate metal film on the substrate;

forming a first photoresist on the gate metal film;

performing semi-exposure process of the first photoresist, and after a development process, forming an entirely-reserved zone, a partially-reserved zone as well as a completely-removed zone for the first photoresist, wherein the entirely-reserved zone for the first photoresist corresponding to the position reserved for the first via hole above the gate line, and the partially-reserved zone for the first photoresist corresponding to the gate electrode and the gate line;

etching the gate metal film corresponding to the completely-removed zone for the first photoresist to form the pattern comprising the gate electrode and the gate line;

removing the first photoresist in the partially-reserved zone for the first photoresist, and part of the photoresist being reserved at the position reserved for the first via hole above the gate line in the non-display area.

In one example, the functional layers of the TFT comprise an active layer, a source electrode, a drain electrode and a TFT channel.

In one example, the step 2 comprises:

forming a semiconductor film, a doped semiconductor film and a source-drain metal film on the substrate after the above steps;

forming a second photoresist on the source-drain metal film;

performing semi-exposure process of the second photoresist, and after a development process, forming an entirely-reserved zone, a partially-reserved zone as well as a completely-removed zone for the second photoresist, wherein the entirely-reserved zone for the second photoresist corresponding to the source electrode, the drain electrode and the position reserved for the second via hole above the data line, and the partially-reserved zone for the first photoresist corresponding to the TFT channel;

etching the source-drain metal film, the doped semiconductor film and the semiconductor film corresponding to the completely-removed zone for the second photoresist, so as to form a pattern for the active layer, the source electrode and the drain electrode;

removing the second photoresist in the partially-reserved zone for the second photoresist, so as to etch and form the TFT channel;

removing the photoresist in the entirely-reserved zone for the second photoresist.

In one example, the step 2 comprises:

forming a semiconductor film, a doped semiconductor film and a source-drain metal film on the substrate after the above steps;

forming a second photoresist on the source-drain metal film;

performing semi-exposure process of the second photoresist, and after a development process, forming an entirely-reserved zone, a first partially-reserved zone, a second partially-reserved zone as well as a completely-removed zone for the second photoresist, wherein the entirely-reserved zone for the second photoresist corresponding to the position reserved for the second via hole above the data line, the first partially-reserved zone for the second photoresist corresponding to the source electrode and the drain electrode, and the second partially-reserved zone for the second photoresist corresponding to the TFT channel, the photoresist in the first partially-reserved zone for the second photoresist has a thickness greater than that of the photoresist in the second partially-reserved zone for the second photoresist;

etching the source-drain metal film, the doped semiconductor film and the semiconductor film corresponding to the completely-removed zone for the second photoresist, so as to form a pattern for the active layer, the source electrode and the drain electrode;

removing the second photoresist in the second partially-reserved zone for the second photoresist, so as to etch and form the TFT channel;

removing the second photoresist in the first partially-reserved zone for the second photoresist, and reserving part of the photoresist in the entirely-reserved zone for the second photoresist.

In one example, the step 3 further comprises:

forming a first conductive film on the substrate after the above steps;

forming the third photoresist on the first conductive film;

performing semi-exposure process of the third photoresist, and after a development process, forming an entirely-reserved zone, a partially-reserved zone as well as a completely-removed zone for the third photoresist, wherein the entirely-reserved zone for the third photoresist corresponding to the position reserved for the second via hole above the data line and the position reserved for the first via hole above the gate line;

etching the first conductive film corresponding to the completely-removed zone for the third photoresist, so as to form a pattern comprising the first film at the position reserved for the first via hole above the gate line and the position reserved for the second via hole above the data line, and at the same time, forming the pattern for the first pixel electrode;

removing the third photoresist in the partially-reserved zone for the third photoresist.

In one example, after the step 4, further comprising:

step 5, forming a pattern comprising the second film inside the first and second via holes.

In one example, the step 5 further comprises:

forming a second conductive film on the substrate After the above steps;

forming the fourth photoresist on the second conductive film;

performing exposure process of the fourth photoresist, and after a development process, forming an entirely-reserved zone and a completely-removed zone for the fourth photoresist, wherein the entirely-reserved zone for the fourth photoresist corresponds to the first via hole and the second via hole, and etching the second conductive film corresponding to the completely-removed zone for the fourth photoresist so as to form a pattern for a second film;

removing the fourth photoresist in the entirely-reserved zone for the fourth photoresist.

In one example, the step 5 further comprises forming a second pixel electrode, the entirely-reserved zone for the fourth photoresist further corresponds to the position where the second pixel electrode is to be formed, and a second pixel electrode is formed synchronously with the formation of the second film.

Still another embodiment of the present invention provides an array substrate, comprising:

a substrate;

gate electrode and gate line provided on the substrate, and a first via hole formed above the gate line in a non-display area;

various functional layers provided on the gate electrode;

a data line provided on the substrate, and a second via hole being formed above the data line in the non-display area;

a first film provided on the data line in the second via hole;

a passivation layer provided on the substrate.

In one example, the first film is also arranged on the gate line in the first via hole.

In one example, the first film is a transparent conductive oxide film.

In one example, the array substrate further comprises:

a first film provided in the first via hole and a second film provided in the second via hole.

In one example, the second film is a transparent conductive oxide film.

Yet another embodiment of the present invention provides a display device comprising any one of the above array substrates.

An array substrate and the method for manufacturing the same as well as a display device provided by the embodiment of present invention forms a first and a second via holes by: Forming the pattern comprising the gate electrode and the gate line on the substrate, and providing photoresist at a position reserved for the first via hole above the gate line in the non-display area; forming the pattern for each functional layers of the TFT and the data line on the substrate after the above steps, and providing photoresist at the position reserved for the second via hole on the data line in the non-display area; forming the pattern comprising the first pixel electrode on the substrate after the above steps, and then forming a passivation layer; while removing the photoresist provided at the position reserved for the first via hole and the film layer thereabove from the substrate after the above steps, removing the photoresist provided at the position reserved for the second via hole and the film layer located thereabove, so as to form the first via hole and the second via hole. With the present solution, due to the first and second via holes are formed by, during the process of forming a pattern comprising the gate electrode, the gate line, various functional layers of the TFT, the data line and the first pixel electrode, providing photoresist at the position reserved for the first via hole above the gate line in the non-display area as well as providing photoresist at the position reserved for the second via hole above the data line in the non-display area, and then removing the photoresist provided at the position reserved for the first via hole and the film layer thereabove while removing the photoresist provided at the position reserved for the second via hole and the film layer provided thereabove, therefore, compared with the prior art, it's possible to reduce the steps for etching via holes above the gate line and the data line, reduce the times of photoetching processes, reduce the manufacture cost for a display device, and improve the yield rate of the product.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

To be specified, the terms "upper", "lower", "inner" and "outer" are only used for illustrating the embodiment of present invention referring the drawings, but not a restrictive wording.

The method for manufacturing an array substrate provided the embodiment of present invention comprises:

step 1, forming a pattern comprising a gate electrode and a gate line on the substrate, and providing photoresist at a position reserved for a first via hole above the gate line in a non-display area;

step 2, forming a pattern for a data line and various functional layers of a TFT on the substrate after the above steps, and providing photoresist at a position reserved for a second via hole above the data line in the non-display area;

step 3, forming a pattern comprising a first pixel electrode on the substrate after the above steps, and then forming a passivation layer;

step 4, while removing the photoresist provided at the position reserved for the first via hole and the film layer thereabove from the substrate after the above steps, removing the photoresist provided at the position reserved for the second via hole and the film layer located thereabove, so as to form the first via hole and the second via hole.

As one embodiment of present invention, the method for manufacturing an array substrate provided by the embodiment of present invention comprises:

S101, forming the pattern comprising the gate electrode and the gate line on the substrate, and providing photoresist at a position reserved for the first via hole above the gate line in the non-display area.

For example, S101 may comprise S201-S205:

5201, forming a gate metal film on the substrate.

For example, the substrate of the embodiment of present invention may be transparent glass substrate or quartz.

For example, the method for forming a gate metal film on the substrate may be depositing a gate metal film of a thickness between 500Å to 4000Å using sputtering or thermal evaporation method.

For example, the material for the gate metal film comprises one or the combination of more than two of the chromium (Cr), tungsten (W), titanium (Ti), tantalum (Ta), molybdenum (Mo), aluminum (Al) or copper (Cu).

Further, the gate metal film composed of multilayer of metals is also available for the embodiment of present invention.

S202, forming a first photoresist on the gate metal film.

S203, performing semi-exposure process of the first photoresist, and after a development process, forming an entirely-reserved zone, a partially-reserved zone as well as a completely-removed zone for the first photoresist, wherein the entirely-reserved zone for the first photoresist corresponding to the position reserved for the first via hole above the gate line, and the partially-reserved zone for the first photoresist corresponding to the gate electrode.

Figure 1:
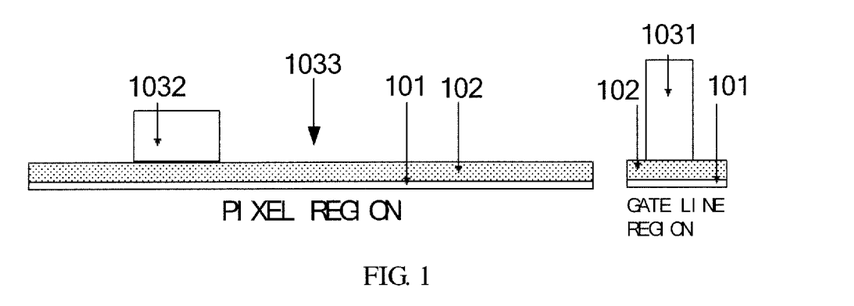
FIG. 1 is a first structural schematic view of an array substrate in a process for making an array substrate provided by an embodiment of present invention.

As illustrated in FIG. 1, performing semi-exposure process of the first photoresist formed on the gate metal film 102 on the substrate 101, and after a development process, forming the entirely-reserved zone 1031, the partially-reserved zone 1032 as well as the completely-removed zone 1033 for the first photoresist, wherein the entirely-reserved zone 1031 for the first photoresist corresponding to the position reserved for the first via hole above the gate line, and the partially-reserved zone 1032 for the first photoresist corresponding to the gate electrode.

The first photoresist in its entirely-reserved zone 1031 has a thickness of about 1 μm to 4 μm, and the first photoresist in its partially-reserved zone 1032 has a thickness of about 0.5 μm to 2 μm.

S204, etching the gate metal film corresponding to the completely-removed zone for the first photoresist to from a pattern comprising the gate electrode and the gate line.

Figure 2:
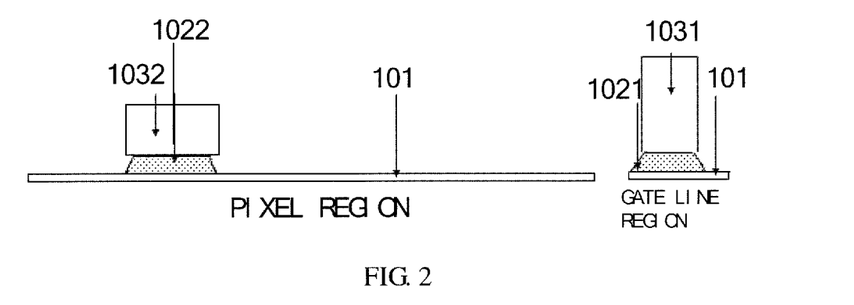
FIG. 2 is a second structural schematic view of the array substrate in the process for making an array substrate provided by the embodiment of present invention.

For example, a chemical process may be available to acid etch the gate metal film corresponding to the completely-removed zone for the first photoresist, wherein the acid may be sulphuric acid, nitric acid, acetic acid or mixture thereof having a certain concentration, so as to from the pattern comprising the gate line 1021 and the gate electrode 1022 as illustrated in FIG. 2.

S205, removing the first photoresist in the partially-reserved zone for the first photoresist, and part of the photoresist being reserved at the position reserved for the first via hole above the gate line in the non-display area.

Figure 3:
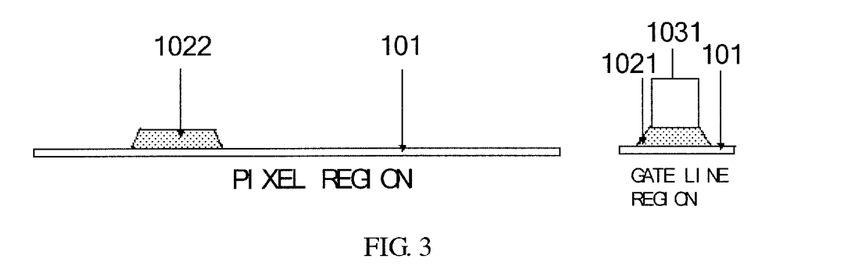
FIG. 3 is a third structural schematic view of the array substrate in the process for making an array substrate provided by the embodiment of present invention.

For example, as illustrated in FIGS. 2 and 3, dry-aching process is carried out so that the first photoresist in its partially-reserved zone 1032 is ashed off under oxygen contained atmosphere, and simultaneously, the first photoresist in its entirely-reserved zone 1031 is thinned, in particular, is thinned to 0.5 μm to 2 μm, and then part of the photoresist is reserved at the position reserved for the first via hole above the gate line in the non-display area.

S102, forming a pattern for the data line and various functional layers of the TFT on the substrate after the above steps, and providing photoresist at the position reserved for the second via hole above the data line in the non-display area.

For example, S102 may comprise S301-S306:

S301, forming a semiconductor film, a doped semiconductor film and a source-drain metal film on the substrate after the above steps.

Between the substrate after the above steps and the semiconductor film, a gate insulating layer may also be formed.

Figure 4:
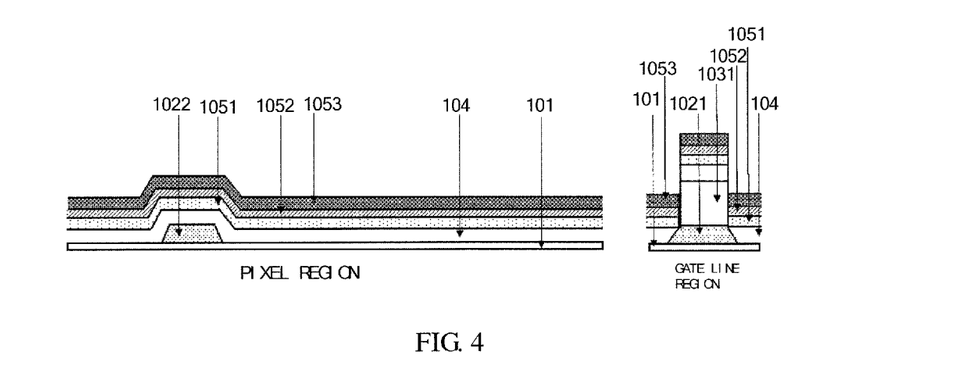
FIG. 4 is a fourth structural schematic view of the array substrate in the process for making an array substrate provided by the embodiment of present invention.

As illustrated in FIG. 4, forming the gate insulating layer 104, the semiconductor film 1051, the doped semiconductor film 1052, the source-drain metal film 1053 on the gate electrode 1022, the substrate 101 and the first photoresist in its entirely-reserved zone 1031.

For example, the chemical vapor phase process is used to deposit a gate insulating layer 104 having a thickness of 1000 Å to 6000 Å, a semiconductor film 1051 having a thickness of 1000 Å to 6000 Å, and a doped semiconductor film 1052 having a thickness of 200 Å to 1000 Å, and also, a method similar to that for depositing the gate metal film is used to deposit a source-drain metal film 1053 having a thickness of 1000 Å to 7000 Å.

The material for the gate insulating layer 104 may be silicon nitride, and may also be silicon oxide or silicon oxynitride, without any limitation in the embodiment of present invention.

S302, forming a second photoresist on the source-drain metal film.

S303, performing semi-exposure process of the second photoresist, and after a development process, forming an entirely-reserved zone, a first partially-reserved zone, a second partially-reserved zone as well as a completely-removed zone for the second photoresist, wherein the entirely-reserved zone for the second photoresist corresponding to the position reserved for the second via hole above the data line, the first partially-reserved zone for the second photoresist corresponding to the source electrode and the drain electrode, and the second partially-reserved zone for the second photoresist corresponding to the TFT channel.

Figure 5:
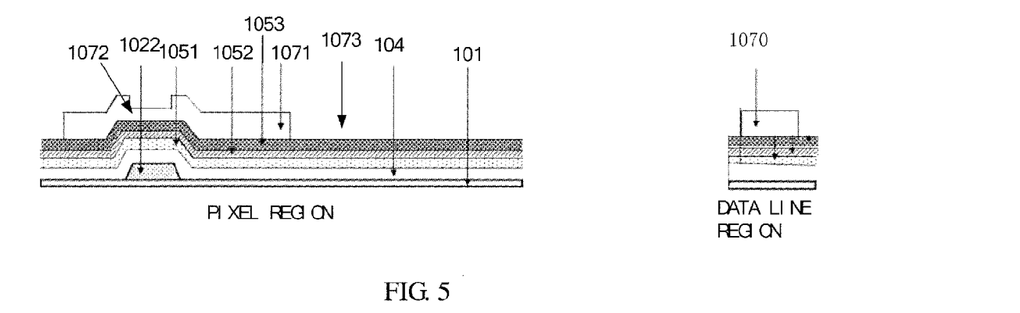
FIG. 5 is a fifth structural schematic view of the array substrate in the process for making an array substrate provided by the embodiment of present invention.

As illustrated in FIG. 5, performing semi-exposure process of the second photoresist on the source-drain metal film 1053, and after the ashing process, forming the entirely-reserved zone 1070, the first partially-reserved zone 1071, the second partially-reserved zone 1072 as well as the completely-removed zone 1073 for the second photoresist, wherein the entirely-reserved zone 1070 for the second photoresist corresponding to the position reserved for the second via hole above the data line, the first partially-reserved zone 1071 for the second photoresist corresponding to the source electrode and the drain electrode, and the second partially-reserved zone 1072 for the second photoresist corresponding to the TFT channel. Wherein, the first partially-reserved zone 1071 for the second photoresist has a thickness greater than that of the second partially-reserved zone 1072 for the second photoresist.

For example, the second photoresist in its first partially-reserved zone 1071 has a thickness of about 1 μm to 2 μm, and the second photoresist in its second partially-reserved zone 1072 has a thickness of about 0.5 μm to 1 μm.

S304, etching the source-drain metal film, the doped semiconductor film and the semiconductor film corresponding to the completely-removed zone for the second photoresist, so as to from a pattern for the active layer, the source electrode and the drain electrode.

Figure 6:
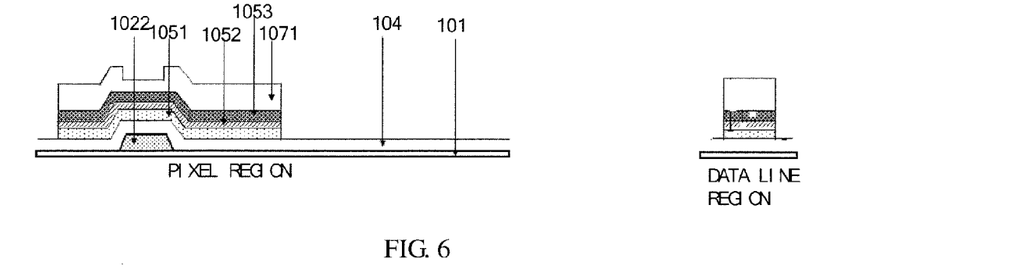
FIG. 6 is a sixth structural schematic view of the array substrate in the process for making an array substrate provided by the embodiment of present invention.

As illustrated in FIGS. 5 and 6, through dry etching, the source-drain metal film 1053, the doped semiconductor film 1052 and the semiconductor film 1051 corresponding to the completely-removed zone 1073 for the second photoresist is etched under the effect of ion-bombardment and chemical reaction; or alternatively, wet etching is firstly used to etch the source-drain metal film 1053 corresponding to the completely-removed zone 1073 for the second photoresist, and then dry etching is employed to etch the doped semiconductor film 1052 and the semiconductor film 1051 corresponding to the completely-removed zone 1073 for the second photoresist, so as to form a pattern comprising an active layer, a source electrode and a drain electrode.

S305, removing the second photoresist in its second partially-reserved zone, and forming photoresist at the position reserved for the second via hole above the data line.

Figure 7:
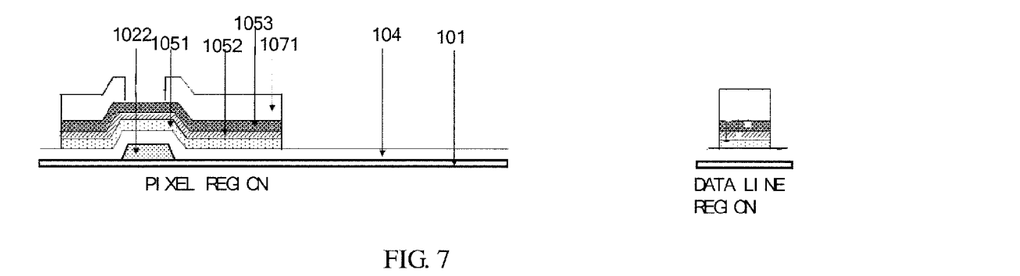
FIG. 7 is a seventh structural schematic view of the array substrate in the process for making an array substrate provided by the embodiment of present invention.

For example, as illustrated in FIG. 7, dry-ashing process is carried out so that the second photoresist in its second partially-reserved zone 1072 is ashed off under oxygen contained atmosphere, and simultaneously, the second photoresist in its entirely-reserved zone 1070 and its first partially-reserved zone 1071 is thinned, in particular, is thinned to 0.2 μm to 1 μm, and then the photoresist is formed at the position reserved for the second via hole above the data line.

S306, etching the source-drain metal film, the doped semiconductor film and part of the semiconductor film so as to form a pattern comprising the TFT channel.

Furthermore, when the pattern for the TFT channel is formed, the photoresist may be further ashed to remove the second photoresist in its first partially-reserved zone 1071, so that the photoresist in the entirely-reserved zone 1070 for the second photoresist is thinned. Therefore, when such a patterning technology is finished, part of the photoresist is remained at the position reserved for the second via hole.

S103, forming the pattern comprising the first pixel electrode on the substrate after the above steps, and then forming a passivation layer.

S104, while removing the photoresist provided at the position reserved for the first via hole and the film layer thereabove from the substrate after the above steps, removing the photoresist provided at the position reserved for the second via hole and the film layer located thereabove, so as to form the first via hole and the second via hole.

For example, stripping technology may be used to remove the photoresist provided at the position reserved for the first via hole and the film layer thereabove, removing the photoresist provided at the position reserved for the second via hole and the film layer located thereabove. To be specified, the "removing" in the embodiment of present invention is not limited to the stripping technology, which is only used for the purpose of illustrating the embodiment of present invention, but not in a sense of limiting. For example, the film layer above the photoresist provided at the position reserved for the first via hole comprises the first pixel electrode and the passivation layer.

Figure 8:
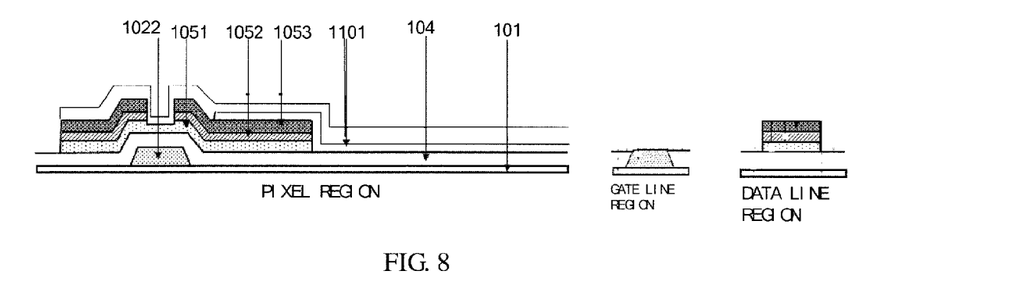
FIG. 8 is an eighth structural schematic view of the array substrate in the process for making an array substrate provided by the embodiment of present invention.

So far, the array substrate as illustrated in FIG. 8 is manufactured, and compared with the prior art, the method for making such an array substrate reduces steps for etching via holes above the gate line and the data line, reduces times for performing the photoetching technology, decreases the cost for making a display device and further, improves yield rate of the product.

In FIGS. 5 to 7, for the simplicity of the drawings, the structure corresponding to the position reserved for the first via hole is not illustrated. However, the structure of the position reserved for the first via hole in FIGS. 5 to 7 may refer to the corresponding structure in FIG. 4. In FIGS. 5 to 7, the structure of the position reserved for the first via hole may, based on that of FIG. 4, form photoresist identical to that above the position reserved for the second via hole in corresponding drawings.

As another implementation of the embodiment of present invention, the method for manufacturing an array substrate comprises:

S401, forming a pattern comprising a gate electrode and a gate line on a substrate, and providing photoresist at a position reserved for a first via hole above the gate line in a non-display area.

S402, forming a pattern for the data line and various functional layers of the TFT on the substrate after the above steps, and providing photoresist at the position reserved for a second via hole above the data line in the non-display area.

S401 and S402 are achieved in a manner similar to that of the above S101 and S102, the tautology thereof is omitted here.

However, step S402 may also adopt a manner different from that of step S102. In this step, during the final process of removing the photoresist, the photoresist at the position reserved for the second via hole may also be removed. Here, the photoresist for the patterning technology may be subjected to exposure using a two-tone mask. For example, S402 may comprise:

S4021, forming a semiconductor film, a doped semiconductor film and a source-drain metal film on the substrate after the above steps.

Between the substrate after the above steps and the semiconductor film, a gate insulating layer may also be formed.

The gate insulating layer, the semiconductor film, the doped semiconductor film, the source-drain metal film are formed on the gate electrode, the substrate and the first photoresist in its entirely-reserved zone.

S4022, forming a second photoresist on the source-drain metal film.

S4023, performing semi-exposure process of the second photoresist, and after a development process, forming an entirely-reserved zone, a partially-reserved zone as well as a completely-removed zone for the second photoresist, wherein the entirely-reserved zone for the second photoresist corresponding to the source electrode, the drain electrode and the position reserved for the second via hole above the data line, and the partially-reserved zone for the first photoresist corresponding to the TFT channel.

Performing semi-exposure process of the second photoresist on the source-drain metal film, and after an aching process, forming the entirely-reserved zone, the partially-reserved zone as well as the completely-removed zone for the second photoresist, wherein the entirely-reserved zone for the second photoresist corresponding to the source electrode, the drain electrode and the position reserved for the second via hole above the data line, and the partially-reserved zone for the first photoresist corresponding to the TFT channel.

For example, the second photoresist in its entirely-reserved zone has a thickness of about 1 µm to 2 µm, and the second photoresist in its partially-reserved zone has a thickness of about 0.5 µm to 1 µm.

S4024, etching the source-drain metal film, the doped semiconductor film and the semiconductor film corresponding to the completely-removed zone for the second photoresist, so as to from a pattern for the active layer, the source electrode and the drain electrode.

S4025, removing the second photoresist in its partially-reserved zone.

Dry-ashing process is performed to ash off the second photoresist in its partially-reserved zone under oxygen contained atmosphere, and simultaneously, the second photoresist in its entirely-reserved zone is thinned, in particular, is thinned into 0.2 µm to 1 µm.

S4026, etching the source-drain metal film, the doped semiconductor film and part of the semiconductor film so as to form a pattern comprising the TFT channel. Afterwards, the photoresist above the source electrode, the drain electrode and the position reserved for the second via hole is removed.

S403, removing the photoresist at the position reserved for the first via hole above the gate line in the non-display area as well as the film layer thereabove.

Figure 9:
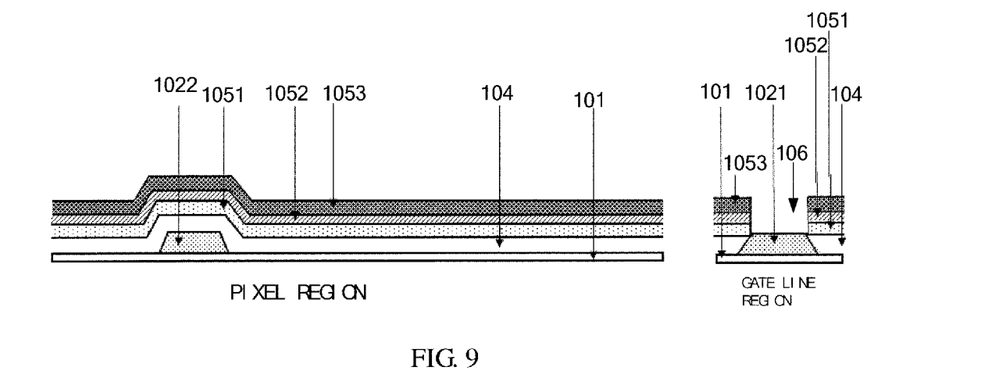
FIG. 9 is a ninth structural schematic view of the array substrate in the process for making an array substrate provided by the embodiment of present invention.

As illustrated in FIG. 9, stripping technology is employed to remove the first photoresist in its entirely-reserved zone as well as the gate insulating layer, the semiconductor film, the doped semiconductor film and the source-drain metal film above the first photoresist in its entirely-reserved zone, so as to form the first via hole 106 above the gate line 1021.

S404, forming a pattern comprising a first pixel electrode on the substrate after the above steps and then forming the passivation layer, and providing photoresist at a position corresponding to the position reserved for the first via hole between the first pixel electrode and the passivation layer. Alternatively, in the above case where the photoresist at the position reserved for the second via hole is removed, it is also necessary to provide photoresist at the position reserved for the second via hole (see FIG. 12).

For example, S404 may comprise S501-S506:

S501, forming a first conductive film on the substrate after the above steps.

Figure 10:
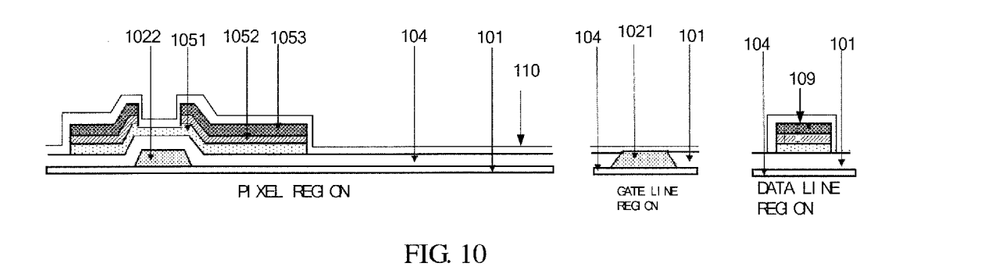
FIG. 10 is a tenth structural schematic view of the array substrate in the process for making an array substrate provided by the embodiment of present invention.

As illustrated in FIG. 10, a first conductive film 110 is formed on the substrate 101.

For example, the material for the first conductive film may be transparent conductive oxide film, such as, Indium Tin Oxides (ITO) or Indium-doped Zinc Oxide (IZO) and have a thickness of 100 Å to 1000 Å, and for the present embodiment, the first conductive film may form a pattern for the first pixel electrode through patterning technology.

S502, forming a third photoresist on the first conductive film.

The third photoresist is formed on the first conductive film. Wherein, the third photoresist covers an extent comprising the pixel area, the position reserved for the first via hole above the gate line and the position reserved for the second via hole above the data line.

S503, performing semi-exposure process of the third photoresist, and after a development process, forming an entirely-reserved zone, a partially-reserved zone as well as a completely-removed zone for the third photoresist, wherein the entirely-reserved zone for the third photoresist corresponding to the position reserved for the second via hole above the data line and the position reserved for the first via hole above the gate line.

Similar to the method of the above embodiments, performing semi-exposure process of the third photoresist on the first conductive film, and after ashing process, forming the entirely-reserved zone, the partially-reserved zone as well as the completely-removed zone for the third photoresist, wherein the entirely-reserved zone for the third photoresist corresponding to the position reserved for the second via hole above the data line and the position reserved for the first via hole above the gate line, and the partially-reserved zone for the third photoresist corresponding to the first conductive film.

For example, the third photoresist in its entirely-reserved zone has a thickness of about 1 µm to 2 µm, and the third photoresist in its partially-reserved zone has a thickness of about 0.5 µm to 1 µm.

S504, etching the first conductive film corresponding to the completely-removed zone for the third photoresist, so as to from a pattern comprising the first film at the position reserved for the first via hole above the gate line and the position reserved for the second via hole above the data line.

Figure 11:
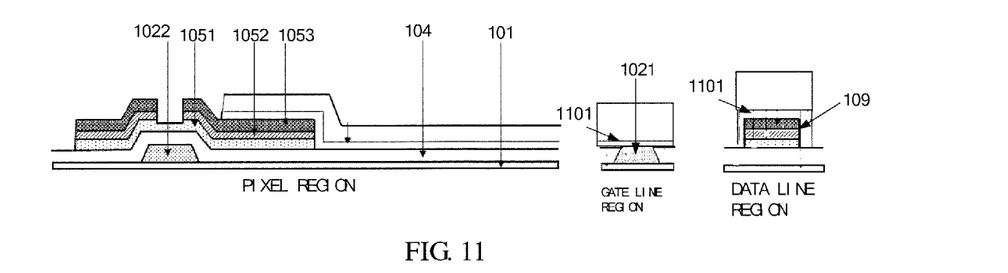
FIG. 11 is an eleventh structural schematic view of the array substrate in the process for making an array substrate provided by the embodiment of present invention.

For example, the material for the first film may be a transparent conductive oxide material, such as ITO or IZO, having a thickness of 100 Å to 1000 Å, provided inside the first via hole as conductor material. As illustrated in FIG. 11, chemical process may be used to carry out acid etching of the first pixel electrode film corresponding to the completely-removed zone for the third photoresist, wherein the acid may be the sulphuric acid, the nitric acid, the acetic acid or mixture thereof with a certain concentration, so that a pattern comprising the first pixel electrode is formed at the pixel area, and a pattern comprising the first film 1101 is formed at the position reserved for the first via hole above the gate line 1021 and at the position reserved for the second via hole above the data line 109.

S505, removing the third photoresist in the partially-reserved zone for the third photoresist.

Figure 12:
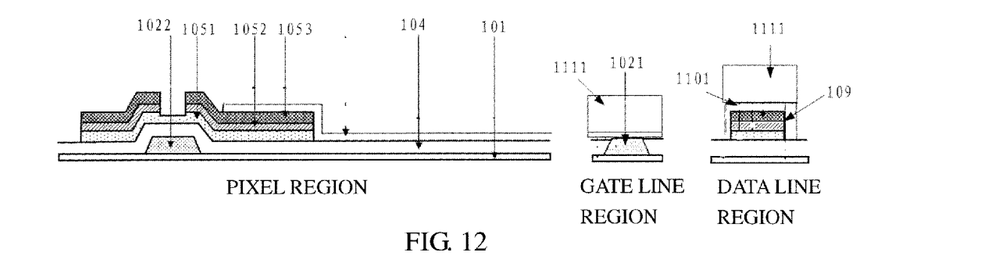
FIG. 12 is a twelfth structural schematic view of the array substrate in the process for making an array substrate provided by the embodiment of present invention.

For example, as illustrated in FIG. 12, dry-aching process is performed to ash off the third photoresist in its partially-reserved zone under oxygen contained atmosphere, and simultaneously, the third photoresist in its entirely-reserved zone 1111 is thinned, in particular, is thinned into 0.2 µm to 1 µm.

S506, forming the passivation layer on the substrate after the above steps.

S405, while removing the photoresist provided at the position reserved for the first via hole and the film layer thereabove from the substrate after the above steps, removing the photoresist provided at the position reserved for the second via hole and the film layer thereabove.

Figure 13:
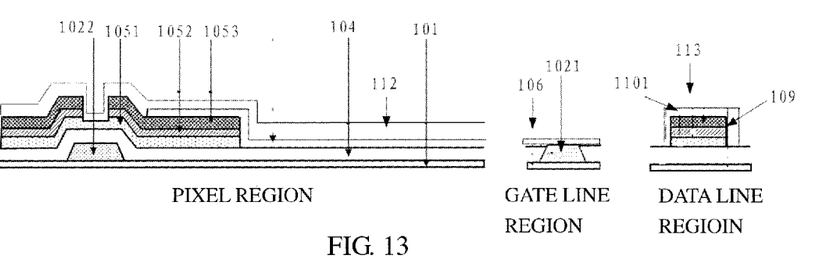
FIG. 13 is a thirteenth structural schematic view of the array substrate in the process for making an array substrate provided by the embodiment of present invention.

So far, the array substrate as illustrated in FIG. 13 is manufactured, and compared with the prior art, the method for making such an array substrate reduces steps for etching via holes above the gate line and the data line, reduces times for performing the photoetching technology, depresses the cost for making a display device and further, improves yield rate of the product.

The method for manufacturing the array substrate of the embodiment of present invention may not only applicable for a Twisted Nematic (TN) type liquid crystal display device, but also for an Advanced Dimension Switch (ADS) type liquid crystal display device.

ADS techniques is such a techniques which, by the parallel electric field generated by the fringes of the pixel electrode in the same plane as well as the longitudinal electric field generated between the pixel electrode layer and the common electrode layer, enables all of the orientating liquid crystal molecules between and above the pixel electrode within the liquid crystal cell occur a rotation conversion and thereby improves the working efficiency of the set of liquid crystal for planar orientation and also increases the transmission efficiency. These techniques may improve frame quality of the TFT-LCD, present advantages such as, higher transmittance, wider viewing angle, and higher aperture opening ratio, lower aberration, lower response duration, no push Mura and so on.

When the array substrate of the embodiment of present invention is intended for the ADS type liquid crystal display device, the method for manufacturing the array substrate according to the embodiment of present invention further comprises S601 after S104 and S405:

Step 601, forming a pattern comprising a second film inside the first and second via holes.

The material for the second film may be a transparent conductive oxide material, such as ITO or IZO, having a thickness of 100 Å to 1000 Å, provided inside the second via hole as conductor material.

For example, in the second embodiment, the method for forming a pattern comprising the second film inside the first and second via holes comprises S701-S705, and the first embodiment is similar thereto:

S701, forming a second conductive film on the substrate after the above steps.

Wherein, the material for the second film may be a transparent conductive oxide material, such as ITO or IZO, having a thickness of 100 Å to 1000 Å.

S702, forming the fourth photoresist on the second conductive film.

S703, the fourth photoresist is subjected to exposure process, and then ashed to form an entirely-reserved zone as well as a completely-removed zone for fourth photoresist, wherein the entirely-reserved zone for the fourth photoresist corresponds to the first and second via holes.

Figure 14:
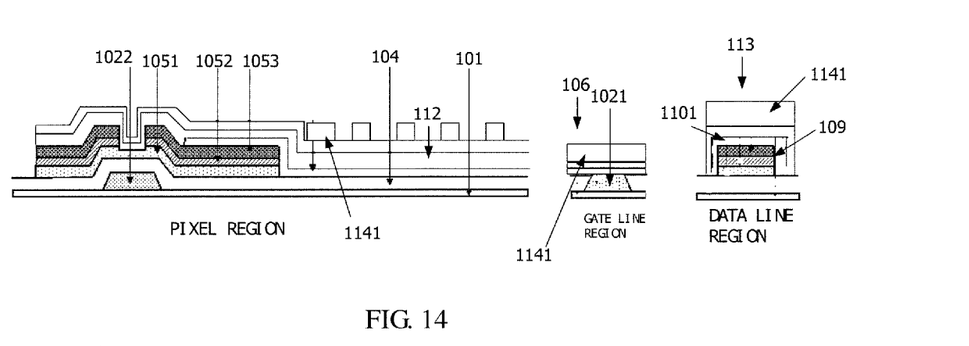
FIG. 14 is a fourteenth structural schematic view of the array substrate in the process for making an array substrate provided by the embodiment of present invention.

As illustrated in FIG. 14, the fourth photoresist 114 is subjected to exposure process after its formed on the second conductive film 113, and then ashed so as to form the entirely-reserved zone 1141 as well as the completely-removed zone for the fourth photoresist, wherein the completely-reserved zone 1141 for the fourth photoresist corresponds to the second pixel electrode, the first via hole 106 as well as the second via hole 113.

S704, etching the second conductive film corresponding to the completely-removed zone for the fourth photoresist to form a pattern comprising the second pixel electrode and the second film.

For example, the material for the second conductive film may be ITO or IZO, and for the present embodiment, the second conductive film may form the pattern for the second pixel electrode through the patterning technology.

S705, removing the fourth photoresist in the entirely-reserved zone for the fourth photoresist.

Voltage may be applied between the first pixel electrode and the second pixel electrode of the embodiment of present invention. For example, one of the two electrodes may be used as the pixel electrode connected with the drain electrode of the TFT, and the other one may be used as the common electrode. In a liquid crystal display, the two pixel electrodes are applied with voltage therebetween so as to drive the crystal molecule molecules rotate. However, in the array substrate of a certain type (for example, Twisted Nematic type) of liquid crystal display, it is also possible to provide only the pixel electrode connecting with the drain electrode of the TFT, no specific limitation is made here. In an array substrate of the OLED, the two pixel electrode may be used as the cathode and anode of the LED respectively.

Thus, S701 to S705 represent the workflow for forming the second pixel electrode by the fourth photoetching technology. Furthermore, as compared with the prior art, in the method for manufacturing an array substrate provided by the embodiment of present invention, two layers of films are formed above the gate line and the data line (that is, the first and second films), such a bi-layer film configuration could protect the position for the via holes from oxidation and erosion even better, and as a result, the product comprises better reliability for life-time service. In the mean time, due to the fact that the via holes above the gate line and the data line is always reserved during the process of the method for making an array substrate of the embodiment of present invention, then compared with the prior art, the step of etching the via holes is no longer needed, which creatively reduces the times of the photoetching technology required for making the array substrate to 4 (as to ADS technology), and as to TN type and OLED array substrates, the times for photoetching technology is reduced to 3.

The method for manufacturing an array substrate provided by the present invention forms the first and second via holes by forming a pattern comprising the gate electrode and the gate line on the substrate, and providing photoresist at the position reserved for the first via hole above the gate line in the non-display area, and then forming a pattern for various functional layers and the data line of the TFT on the substrate after the above steps as well as providing photoresist at the position reserved for second via hole above the data line in the non-display area, and forming a pattern comprising the first pixel electrode on the substrate after the above steps and then forming a passivation layer, removing the photoresist provided at the position reserved for the first via hole and the film layer thereabove from the substrate after the above steps, and at the same time, removing the photoresist provided at the position reserved for the second via hole and the film layer thereabove. With the present solution, due to the first and second via holes are formed by, during the process of forming a pattern comprising the gate electrode, the gate line, various functional layers of the TFT, the data line and the first pixel electrode, providing photoresist at the position reserved for the first via hole above the gate line in the non-display area as well as providing photoresist at the position reserved for the second via hole above the data line in the non-display area, and then removing the photoresist provided at the position reserved for the first via hole and the film layer thereabove while removing the photoresist provided at the position reserved for the second via hole and the film layer provided thereabove, therefore, compared with the prior art, it is possible to reduce the steps for etching via holes above the gate line and the data line, reduce the times of photoetching processes, reduce the manufacture cost for a display device, and improve the yield rate of the product.

Corresponding to the above method for manufacturing an array substrate, the embodiment of present invention provides an array substrate comprising:
  a substrate;
  a gate electrode and a gate line provided on the substrate, and a first via hole formed above the gate line in a non-display area;
  various functional layers provided on the gate electrode;
  a data line provided on the substrate, and a second via hole being formed above the data line in the non-display area;
  a first film provided on the data line;
  a passivation layer provided on the substrate.

Further, the first film is also arranged inside the first via hole.

Wherein, it is known from the method for manufacturing the above array substrate that the first film is formed by forming a first conductive film on the substrate after the above steps and then etching in the same layer to the first pixel electrode of the display area.

Further, the array substrate further comprises:
a second film provided on the first film inside the first via hole as well as inside the second via hole.

Wherein, it is known from the method for manufacturing the above array substrate that the second film is formed by forming a second conductive film on the substrate after the above steps and then etching in the same layer to the second pixel electrode of the display area.

Further, material for the gate line comprises one or the combination of more than two of the chromium (Cr), tungsten (W), titanium (Ti), tantalum (Ta), molybdenum (Mo), aluminum (Al) or copper (Cu).

Further, the material for the first pixel electrode and/or the second pixel electrode is a transparent conductive oxide, such as the Indium Tin Oxides ITO or IZO.

The embodiment of present invention provides a display device comprising an array substrate comprising any of the above features. The display device may be a liquid crystal display device comprising the color filter substrates and the array substrate proposed in the above embodiments, which are arranged to be opposite and parallel to each other, and the liquid crystal filled between the color filter substrate and the array substrate; the display device may also be an OLED display device comprising an array substrate submitted by the above embodiments as well as organic luminescent materials evaporated on the array substrate and encapsulation cover plate.

The liquid crystal display device provided by the embodiment of present invention may be the products or components having display function, such as a liquid crystal display, a liquid crystal TV, a digital photo frame, a cellphone, a tablet, and so on, no limitation is made by the present invention.

The foregoing is merely exemplary embodiments of the invention, but is not used to limit the protection scope of the invention. The protection scope of the invention shall be defined by the attached claims.

What is claimed is:

1. A method for manufacturing an array substrate, comprising:
  step 1, forming a pattern comprising a gate electrode and a gate line on a substrate, and providing photoresist at a position reserved for a first via hole above the gate line in a non-display area;
  step 2, forming a pattern of functional layers of a thin film transistor (TFT) and a data line on the substrate after the above step;
  step 3, forming a pattern comprising a first pixel electrode on the substrate after the above steps, and then forming a passivation layer;
  step 4, removing the photoresist provided above the position reserved for the first via hole and film layer thereabove from the substrate after the above steps, so as to form the first via hole.

2. The method for manufacturing the array substrate according to claim 1, wherein,
  after the step 2, photoresist is retained at a position reserved for a second via hole above the data line in the non-display area; or alternatively, in step 3, photoresist is provided at the position reserved for the second via hole above the data line in the non-display area, and between the first pixel electrode and the passivation layer, and
  in step 4, while removing the photoresist provided above the position reserved for the first via hole so as to form the first via hole, removing the photoresist provided at the position reserved for the second via hole to form the second via hole.

3. The method for manufacturing the array substrate according to claim 1, wherein,
between the steps 2 and 3, further comprising:
removing the photoresist at the position reserved for the first via hole above the gate line in the non-display area as well as the film layer thereabove;
the step 3 further comprises:
providing photoresist between the first pixel electrode and the passivation layer at a position corresponding to the position reserved for the first via hole.

4. The method for manufacturing an array substrate according to claim 1, the step 1 comprises:
forming a gate metal film on the substrate;
forming a first photoresist on the gate metal film;
performing semi-exposure process of the first photoresist, and after a development process, forming an entirely-reserved zone, a partially-reserved zone as well as a completely-removed zone for the first photoresist, wherein the entirely-reserved zone for the first photoresist corresponding to the position reserved for the first via hole above the gate line, and the partially-reserved zone for the first photoresist corresponding to the gate electrode and the gate line;
etching the gate metal film corresponding to the completely-removed zone for the first photoresist to form the pattern comprising the gate electrode and the gate line;
removing the first photoresist in the partially-reserved zone for the first photoresist, and part of the photoresist being reserved at the position reserved for the first via hole above the gate line in the non-display area.

5. The method for manufacturing the array substrate according to claim 1, wherein the functional layers of the TFT comprise an active layer, a source electrode, a drain electrode and a TFT channel.

6. The method for manufacturing the array substrate according to claim 1, wherein the step 2 comprises:
forming a semiconductor film, a doped semiconductor film and a source-drain metal film on the substrate after the above steps;
forming a second photoresist on the source-drain metal film;
performing semi-exposure process of the second photoresist, and after a development process, forming an entirely-reserved zone, a partially-reserved zone as well as a completely-removed zone for the second photoresist, wherein the entirely-reserved zone for the second photoresist corresponding to the source electrode, the drain electrode and the position reserved for the second via hole above the data line, and the partially-reserved zone for the first photoresist corresponding to the TFT channel;
etching the source-drain metal film, the doped semiconductor film and the semiconductor film corresponding to the completely-removed zone for the second photoresist, so as to form a pattern for the active layer, the source electrode and the drain electrode;
removing the second photoresist in the partially-reserved zone for the second photoresist, so as to etch and form the TFT channel;
removing the photoresist in the entirely-reserved zone for the second photoresist.

7. The method for manufacturing the array substrate according to claim 1, wherein the step 2 comprises:
forming a semiconductor film, a doped semiconductor film and a source-drain metal on the substrate after the above steps;
forming a second photoresist on the source-drain metal film;
performing semi-exposure process of the second photoresist, and after a development process, forming an entirely-reserved zone, a first partially-reserved zone, a second partially-reserved zone as well as a completely-removed zone for the second photoresist, wherein the entirely-reserved zone for the second photoresist corresponding to the position reserved for the second via hole above the data line, the first partially-reserved zone for the second photoresist corresponding to the source electrode and the drain electrode, and the second partially-reserved zone for the second photoresist corresponding to the TFT channel, the photoresist in the first partially-reserved zone for the second photoresist has a thickness greater than that of the photoresist in the second partially-reserved zone for the second photoresist;
etching the source-drain metal film, the doped semiconductor film and the semiconductor film corresponding to the completely-removed zone for the second photoresist, so as to form a pattern for the active layer, the source electrode and the drain electrode;
removing the second photoresist in the second partially-reserved zone for the second photoresist, so as to etch and form the TFT channel;
removing the second photoresist in the first partially-reserved zone for the second photoresist, and reserving part of the photoresist in the entirely-reserved zone for the second photoresist.

8. The method for manufacturing the array substrate according to claim 3, wherein the step 3 further comprises:
forming a first conductive film on the substrate after the above steps;
forming a third photoresist on the first conductive film;
performing semi-exposure process of the third photoresist, and after a development process, forming an entirely-reserved zone, a partially-reserved zone as well as a completely-removed zone for the third photoresist, wherein the entirely-reserved zone for the third photoresist corresponding to the position reserved for the second via hole above the data line and the position reserved for the first via hole above the gate line;
etching the first conductive film corresponding to the completely-removed zone for the third photoresist, so as to form a pattern comprising a first film at the position reserved for the first via hole above the gate line and the position reserved for the second via hole above the data line, and at the same time, forming the pattern for the first pixel electrode;
removing the third photoresist in the partially-reserved zone for the third photoresist.

9. The method for manufacturing the array substrate according to claim 1, wherein, after the step 4, further comprising:
step 5, forming a pattern comprising the second film inside the first and second via holes.

10. The method for manufacturing the array substrate according to claim 9, wherein the step 5 further comprises:
forming a second conductive film on the substrate after the above steps;
forming the fourth photoresist on the second conductive film;

performing exposure process of the fourth photoresist, and after a development process, forming an entirely-reserved zone and a completely-removed zone for the fourth photoresist, wherein the entirely-reserved zone for the fourth photoresist corresponds to the first via hole and the second via hole, and etching the second conductive film corresponding to the completely-removed zone for the fourth photoresist so as to form a pattern for a second film;

removing the fourth photoresist in the entirely-reserved zone for the fourth photoresist.

11. The method for manufacturing the array substrate according to claim 10, wherein the step 5 further comprises forming a second pixel electrode, the entirely-reserved zone for the fourth photoresist further corresponds to the position where a second pixel electrode is to be formed, and the second pixel electrode is formed synchronously with the formation of the second film.

12. The method for manufacturing the array substrate according to claim 2, wherein, between the steps 2 and 3, further comprising:

removing the photoresist at the position reserved for the first via hole above the gate line in the non-display area as well as the film layer thereabove;

the step 3 further comprises:

providing photoresist between the first pixel electrode and the passivation layer at a position corresponding to the position reserved for the first via hole.

13. The method for manufacturing an array substrate according to claim 2, the step 1 comprises:

forming a gate metal film on the substrate;

forming a first photoresist on the gate metal film;

performing semi-exposure process of the first photoresist, and after a development process, forming an entirely-reserved zone, a partially-reserved zone as well as a completely-removed zone for the first photoresist, wherein the entirely-reserved zone for the first photoresist corresponding to the position reserved for the first via hole above the gate line, and the partially-reserved zone for the first photoresist corresponding to the gate electrode and the gate line;

etching the gate metal film corresponding to the completely-removed zone for the first photoresist to form the pattern comprising the gate electrode and the gate line;

removing the first photoresist in the partially-reserved zone for the first photoresist, and part of the photoresist being reserved at the position reserved for the first via hole above the gate line in the non-display area.

14. The method for manufacturing the array substrate according to claim 2, wherein the functional layers of the TFT comprise an active layer, a source electrode, a drain electrode and a TFT channel.

* * * * *